United States Patent
Song et al.

(10) Patent No.: US 7,166,541 B2
(45) Date of Patent: Jan. 23, 2007

(54) METHOD OF FORMING DIELECTRIC LAYER USING PLASMA ENHANCED ATOMIC LAYER DEPOSITION TECHNIQUE

(75) Inventors: Min-Woo Song, Seongnam-si (KR); Seok-Jun Won, Seoul (KR); Yong-Kuk Jeong, Seoul (KR); Dae-Jin Kwon, Seoul (KR); Weon-Hong Kim, Suwon-si (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 11/149,498

(22) Filed: Jun. 9, 2005

(65) Prior Publication Data

US 2006/0014398 A1 Jan. 19, 2006

(30) Foreign Application Priority Data

Jul. 19, 2004 (KR) ................ 10-2004-0056126

(51) Int. Cl.
*H01L 21/31* (2006.01)
(52) U.S. Cl. .................. 438/770; 438/758; 438/778; 257/E21.274
(58) Field of Classification Search ........... 438/778, 438/758, 200, 761, 785, 770
See application file for complete search history.

(56) References Cited

U.S. PATENT DOCUMENTS

| | | | |
|---|---|---|---|
| 5,618,761 A * | 4/1997 | Eguchi et al. ............ 438/785 |
| 6,486,047 B2 | 11/2002 | Lee et al. ................. 438/513 |
| 6,884,738 B2 * | 4/2005 | Asai et al. ................. 438/758 |
| 2002/0086476 A1 * | 7/2002 | Kim et al. ................. 438/200 |
| 2003/0181060 A1 * | 9/2003 | Asai et al. ................. 438/758 |
| 2003/0232510 A1 * | 12/2003 | Buchanan et al. ........ 438/778 |
| 2004/0043544 A1 * | 3/2004 | Asai et al. ................. 438/149 |
| 2005/0282398 A1 * | 12/2005 | Mungekar et al. ........ 438/758 |
| 2006/0014397 A1 * | 1/2006 | Seamons et al. .......... 438/778 |
| 2006/0035470 A1 * | 2/2006 | Horii et al. ............... 438/758 |

FOREIGN PATENT DOCUMENTS

KR 2001-0111448 12/2001
KR 2002-0064126 8/2002

* cited by examiner

*Primary Examiner*—Asok K. Sarkar
*Assistant Examiner*—Victor V. Yevikov
(74) *Attorney, Agent, or Firm*—Mills & Onello LLP

(57) ABSTRACT

A method of forming a dielectric layer using a plasma enhanced atomic layer deposition technique includes: loading a semiconductor substrate having a three-dimensional structure into a reaction chamber; and repeatedly performing the following steps until a dielectric layer with a desired thickness is formed: supplying a source gas into the reaction chamber; stopping the supply of the source gas and purging the source gas remaining inside the reaction chamber; and supplying oxygen gas into the reaction chamber after purging the source gas, and applying RF power for oxygen plasma treatment, a level of the applied RF power and a partial pressure of the oxygen gas being increased concurrently with an increased aspect ratio of the three-dimensional structure.

15 Claims, 6 Drawing Sheets

METHOD OF FORMING DIELECTRIC LAYER USING PLASMA ENHANCED ATOMIC LAYER DEPOSITION TECHNIQUE

CROSS-REFERENCE TO RELATED APPLICATION

This application claims priority to Korean Patent Application No. 2004-56126, filed on Jul. 19, 2004, the disclosure of which is hereby incorporated herein by reference in its entirety.

BACKGROUND OF INVENTION

1. Technical Field

The present invention relates to a method of forming a dielectric layer, and more particularly, to a method of forming a dielectric layer using a plasma enhanced atomic layer deposition technique.

2. Discussion of the Related Art

With the continued progression toward higher integration of semiconductor devices, a gate dielectric layer and a capacitor dielectric layer are required to exhibit the qualities of low leakage current and high capacitance within a limited area in transistor and capacitor devices. In this regard, the gate dielectric layer and the capacitor dielectric layer are preferably formed of high-k dielectric layers.

For depositing the dielectric layers, a sputtering method as such as physical vapor deposition method, or a chemical vapor deposition (CVD) method, are commonly employed. However, the sputtering method provides poor step coverage in regions where a step height difference is present. The CVD method offers the advantage of suitable step coverage and a high production yield, but also has the disadvantage of requiring a high temperature for forming a thin film. The CVD method is further limited in ability to precisely control the resulting thickness of the thin film to the degree of accuracy required, which, in highly integrated semiconductor devices, can be on the order of several Recently, an atomic layer deposition (ALD) technique has been introduced to address the limitation of the CVD method and to form a thin film having a fine thickness according to the unit of an atomic layer.

The ALD method is characterized in that several thin films of atomic layers are alternately deposited by injecting each reactant material by a gas pulsing type to chemically deposit the reactant material on a substrate surface, and repeating the operation cycle several times. Particularly, the ALD method has been recently employed to meet the demands for forming a thin film with a high aspect ratio, with a high surface uniformity even in situations where the surface is relatively uneven, and with excellent electrical and physical properties. The gas pulsing type is a method of alternately supplying a reactant gas and a purge gas. Thin film formation using ALD offers advantages in that a deposited thin film has little residual material, and thickness control is relatively easy and reliable even in the case of thin film deposition with a thickness of 200 or less.

However, in the case where the thin film formation method using the ALD technique employs precursors having a high reactivity, it is difficult to secure reproducibility and reliability in the deposition process because the chemical and thermal stabilities of precursors can deteriorate. Further, removal of the precursors having high reactivity by a purging process can be a time-consuming process because it takes quite long to purge the reactant material adsorbed inside the chamber, thereby decreasing deposition speed and deteriorating fabrication productivity. Furthermore, in the case of using a reactant gas having a low reactivity, yet is stable chemically and thermally, increased deposition temperature is needed in order to activate surface reaction because of the low reactivity.

Among the efforts to overcome the decrease in productivity due to a decreased deposition speed in the thin film formation method using the ALD technique, a new method referred to as plasma enhanced atomic layer deposition (PEALD) has been recently introduced.

In the PEALD method, a first reactant gas is injected into a reaction chamber to adsorb the gas on a wafer surface, and a purge gas is supplied to remove the residual first reactant gas out of the reaction chamber. Then, a second reactant gas, which is excited by a plasma generator, is supplied into the reaction chamber. A method of forming a dielectric layer using the PEALD technique is disclosed in U.S. Pat. No. 6,486,047 in the title of "Apparatus for forming strontium-tantalum-oxide thin film", the contents of which are incorporated herein by reference.

In the disclosure of U.S. Pat. No. 6,486,047, a strontium tantalum thin film is formed. In particular, a substrate is disposed inside a reaction chamber and heated. A source gas including strontium tantalum ethoxide is supplied into the reaction chamber along with a carrier gas. The vaporized source gas in the carrier gas is drawn out of the reaction chamber by a purge gas. An oxygen gas is supplied into the reaction chamber and becomes plasma. The oxygen plasma is drawn out of the reaction chamber by a purge gas.

However, the method disclosed in U.S. Pat. No. 6,486,047 is limited only to the source gas including strontium tantalum ethoxide, and cannot prevent the leakage current deterioration that commonly associated with an increase in device aspect ratio.

In the conventional formation method of a dielectric layer, leakage current characteristics are generally poor in a one-cylinder storage (OCS) cell capacitor having an aspect ratio of 7:1 or higher, but step coverage characteristics is improved by 85%. It is generally regarded that the deterioration of a leakage current results from the increase of impurities such as carbon within the layers due to the lack of oxygen radicals in the structure holes, not from the decrease of layer thickness, that is, a problem of step coverage characteristics. However, the increase of RF power to increase the amount of oxygen radicals may cause plasma damage to the device, and can cause a haze phenomenon at the edge portions of a wafer.

Therefore, a layer formation method technique that is capable of providing excellent electrical characteristics for preventing leakage current deterioration as well as a high deposition speed and suitable step coverage is desired.

SUMMARY OF THE INVENTION

The present invention provides a method of forming a dielectric layer using a plasma enhanced atomic layer deposition (PEALD) technique for preventing leakage current deterioration in semiconductor devices.

Another object of the present invention is to provide a method of forming a dielectric layer having excellent dielectric characteristics while addressing the problem of low deposition speed of the ALD technique using a plasma enhanced atomic layer deposition (PEALD) technique.

In one aspect, the present invention is directed to a method of forming a dielectric layer using a plasma enhanced atomic layer deposition (PEALD) technique. A semiconductor substrate having a three-dimensional structure is loaded into a reaction chamber. The following steps are repeatedly performed until a dielectric layer with a desired thickness is formed: supplying a source gas into the reaction chamber; stopping the supply of the source gas and purging the source gas remaining inside the reaction chamber; and supplying oxygen gas into the reaction chamber after purging the source gas, and applying RF power for oxygen plasma treatment, a level of the applied RF power and a partial pressure of the oxygen gas being increased concurrently with an increased aspect ratio of the three-dimensional structure.

In one embodiment, the method further comprises purging the source gas following each oxygen plasma treatment.

In another embodiment, the temperature of the semiconductor substrate is maintained at about 100 to 550° C.

In another embodiment, purging the source gas is performed by supplying Ar or $O_2$ gas.

In another embodiment, the pressure of the reaction chamber is maintained at about 0.5 to 10 torr.

In another embodiment, the oxygen plasma treatment is performed for a time duration of about 0.1 to 10 seconds.

In another embodiment, the source gas includes one selected from the group consisting of aluminum (Al), hafnium (Hf), lanthanum (La), tantalum (Ta), and zirconium (Zr).

In another embodiment, the dielectric layer is one layer selected from the group consisting of $Al_2O_3$, $HfO_2$, $Ta_2O_5$, $La_2O_5$, and $ZrO_2$.

In another embodiment, the method further comprises performing a vacuum annealing treatment or an annealing treatment in the presence of an oxygen atmosphere at a temperature of about 400 to 1000° C. after forming the dielectric layer.

In another embodiment, the RF power is in the range of about 80 to 1000 W, and the oxygen partial pressure is in the range of about 25 to 90% when the aspect ratio of the three-dimensional structure is above about 4 to less than about 7.

In another embodiment, the RF power is in the range of about 150 to 1000 W, and the oxygen partial pressure is in the range of about 35 to 90% when the aspect ratio of the three-dimensional structure is above about 7 to less than about 100.

In another embodiment, flow rates of the argon gas and the oxygen gas supplied for the oxygen plasma treatment are about 200 sccm and in the range of about 65 to 1800 sccm respectively.

In another embodiment, the method further comprises supplying an oxygen gas before the oxygen plasma treatment.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

The present invention will now be described more fully hereinafter with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout the specification.

Figure 1:
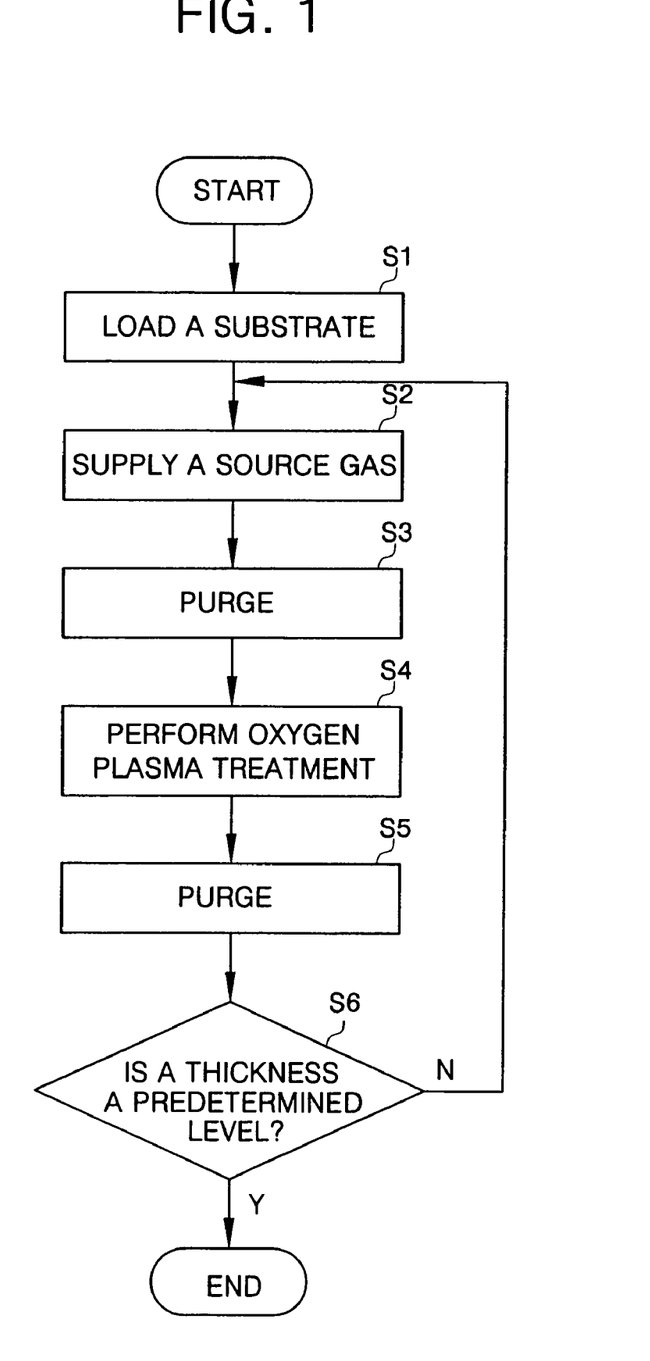
FIG. 1 is a flow chart illustrating the process sequence of a method of forming a dielectric layer using a plasma enhanced atomic layer deposition (PEALD) technique according to a first embodiment of the present invention.
Figure 2:
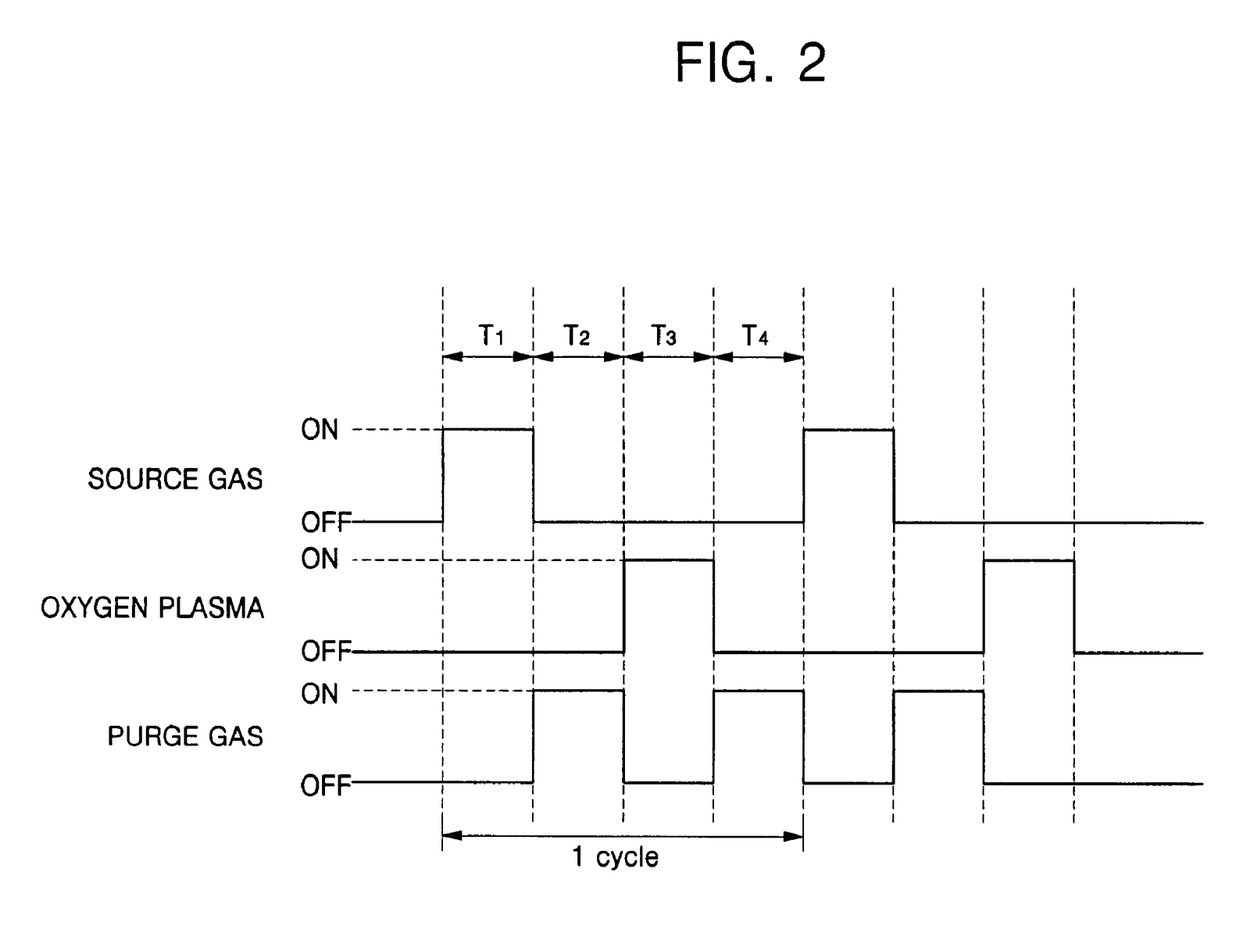
FIG. 2 is a gas pulsing diagram of the method of forming a dielectric layer according to the first embodiment of the present invention.

FIG. 1 is a flow chart illustrating the process sequence of a method of forming a dielectric layer using a plasma enhanced atomic layer deposition (PEALD) technique according to a first embodiment of the present invention, and FIG. 2 is a gas pulsing diagram of the method of forming a dielectric layer according to the first embodiment of the present invention.

Referring to FIGS. 1 and 2, a semiconductor substrate having a three-dimensional structure is loaded into a reaction chamber (S1). The three-dimensional structure is the structure having a predetermined width, length, and height, for example, a cylindrical-shaped capacitor, a transistor structure, or the like. A source gas is supplied into the reaction chamber for a time period T1 with a pulsing type supply to adsorb the source gas on the surface of the semiconductor substrate (S2). Then, an inert purge gas is supplied for a time period T2 in order to purge the reaction chamber by removing the chemical compounds physically adsorbed on the surface of the semiconductor substrate and any residual gas (S3). Then, the inside of the reaction chamber after the purging process is treated with oxygen plasma for a time period T3 (S4). After the oxygen plasma treatment, an inert purge gas is supplied into the reaction chamber for a time period T4 to remove the residual oxygen gas from the reaction chamber (S5). It is determined whether the thickness of the dielectric layer has reached a predetermined level (S6). If not, the cycle of steps S2 to S6 are repeated additional times until the dielectric layer is formed to a desired predetermined thickness. The dielectric layer may, in one example, be one selected from $Al_2O_3$, $HfO_2$, $Ta_2O_5$, $La_2O_5$, and $ZrO_2$.

In the first embodiment, the oxygen plasma treatment (S4) is performed by increasing the plasma RF power and an oxygen partial pressure concurrently with an increase in the aspect ratio of the three-dimensional structure of the semiconductor substrate. The term "aspect ratio", as referred to herein, means the ratio of the height of the three-dimensional structure relative to its width. The plasma RF power is preferably in the range of 80 to 1000 W, and the oxygen partial pressure is preferably in the range of 25 to 90%, in the case that the aspect ratio of the three-dimensional structure is above 4 to less than about 7. In the case where the aspect ratio of the three-dimensional structure is greater than about 7 to less than about 100, the plasma RF power is preferably in the range of 150 to 1000 W, and the oxygen partial pressure is preferably in the range of 35 to 90%. The oxygen partial pressure refers to a ratio of the oxygen flow amount relative to the overall plasma gas flow amount. When an argon (Ar) gas as a carrier gas is supplied at 200 sccm, the oxygen flow rate of the supplied oxygen may be in the range of 65 to 1800 sccm. The oxygen plasma treatment step (S4) can be performed over a time duration of about 0.1 to 10 seconds.

In the first embodiment, the reaction chamber for forming the dielectric layer is maintained with a pressure of 0.5 to 10.

Further, the temperature of the semiconductor substrate inside the reaction chamber is maintained at a temperature of 100 to 550° C.

In the first embodiment, the source gas is one selected from aluminum (Al), hafnium (Hf), lanthanum (La), tantalum (Ta), and zirconium (Zr).

After the dielectric layer is formed to the desired thickness at step (S6) in the first embodiment, a vacuum annealing treatment or an annealing treatment in the presence of an oxygen atmosphere at a temperature of 400 to 1000° C. may be further performed to improve the electric characteristics of the resulting dielectric layer.

The purging process can employ an argon gas in the first embodiment, but an oxygen gas may be used for the purging process in the case where the source gas does not react with the oxygen gas.

Figure 3:
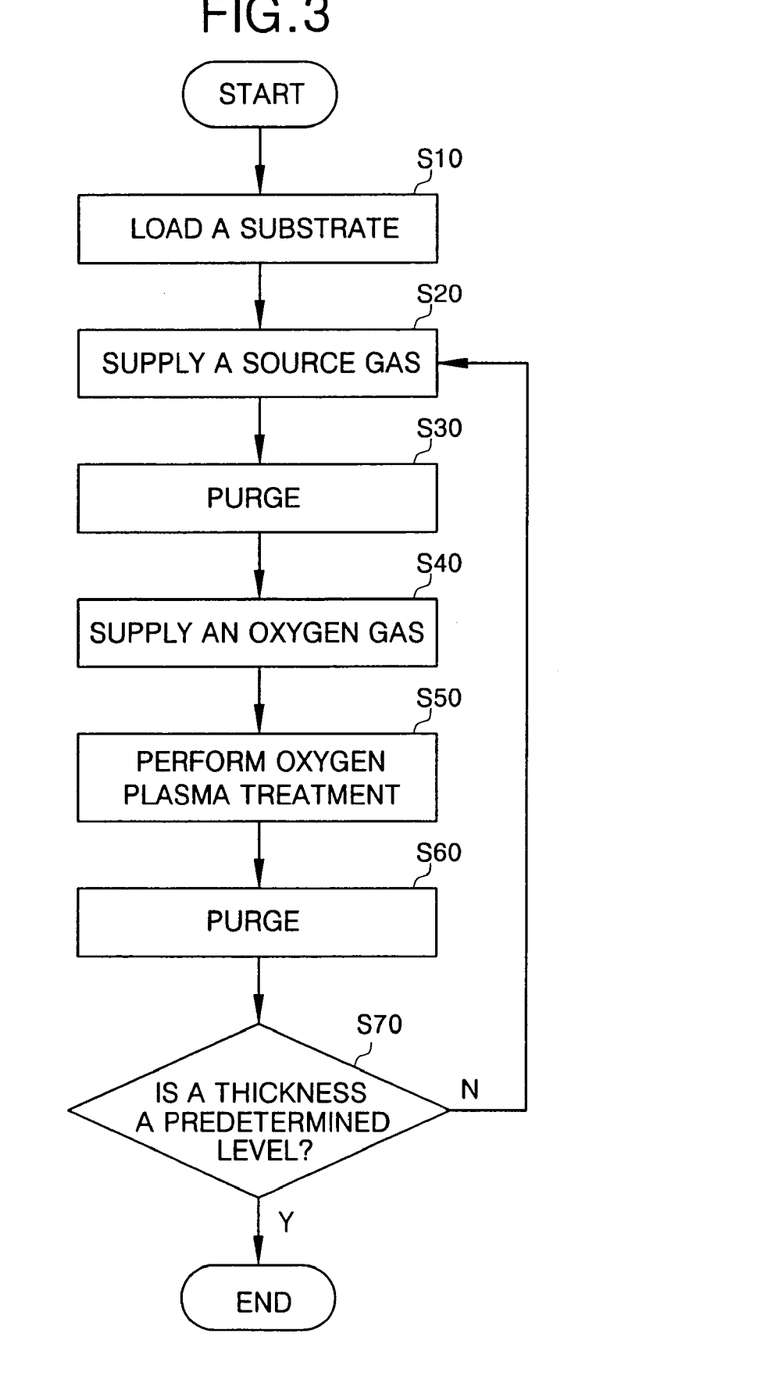
FIG. 3 is a flow chart illustrating the process sequence of a method of forming a dielectric layer using a PEALD technique according to a second embodiment of the present invention.
Figure 4:
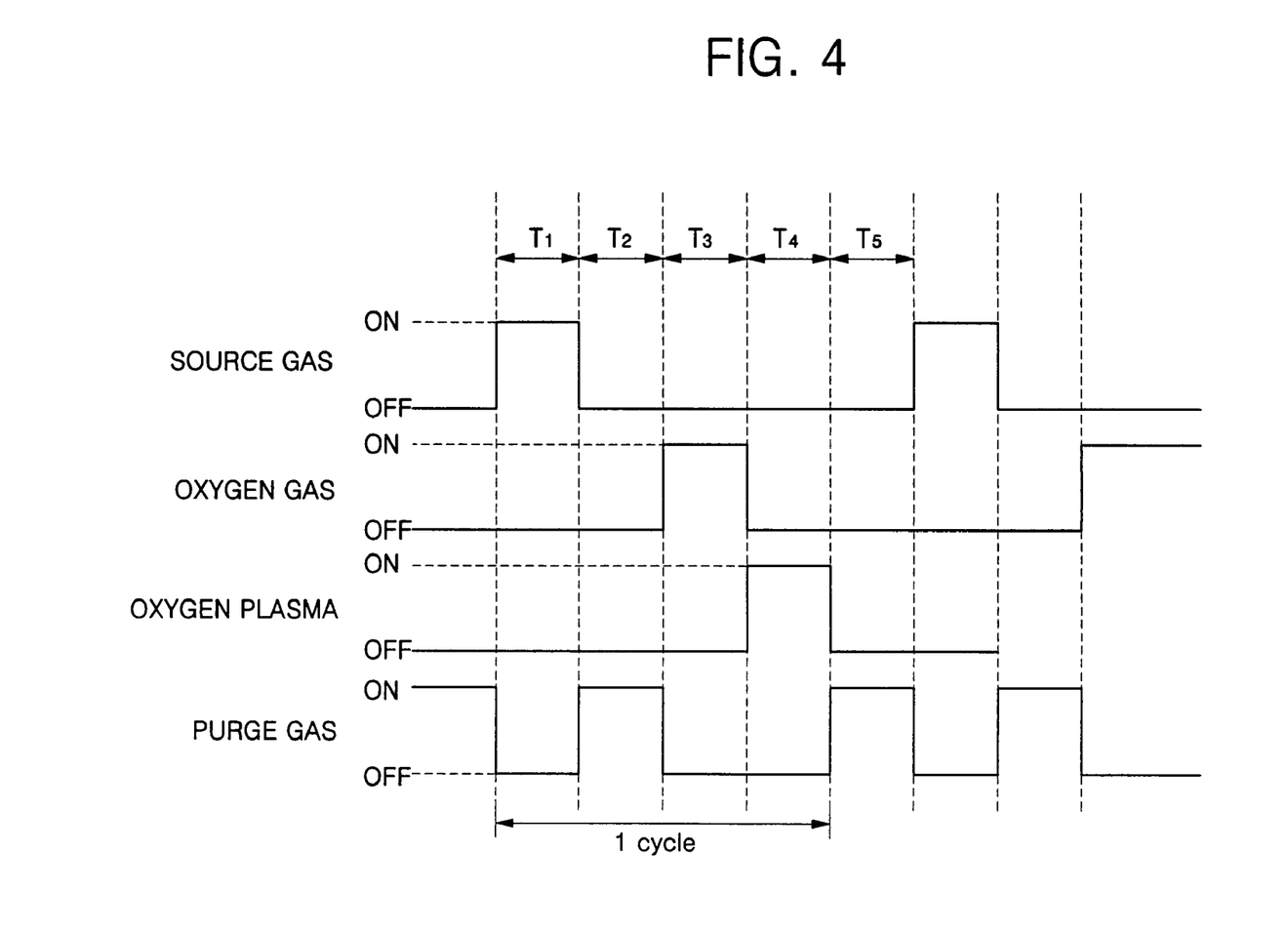
FIG. 4 is a gas pulsing diagram of the method of forming a dielectric layer according to the second embodiment of the present invention.

FIG. 3 is a flow chart illustrating the process sequences of a method of forming a dielectric layer using a plasma enhanced atomic layer deposition technique according to a second embodiment of the present invention, and FIG. 4 is a gas pulsing diagram of the method of forming a dielectric layer according to the second embodiment of the present invention.

Referring to FIGS. 3 and 4, a semiconductor substrate having a three-dimensional structure is loaded into a reaction chamber (S10). The three-dimensional structure is a structure having a predetermined width, length, and height, for example, a cylindrical-shaped capacitor, a transistor structure, or the like. A source gas is supplied into the reaction chamber for a time period T1 with a pulsing type supply to adsorb the source gas on the surface of the semiconductor substrate (S20). Then, an inert purge gas is supplied for a time period T2 in order to purge the reaction chamber by removing the chemical compounds physically adsorbed on the surface of the semiconductor substrate and a residual gas (S30). Then, after the purging process, the reaction chamber is supplied with an oxygen gas for a time period T3 (S40). The oxygen gas supply stabilizes the oxygen partial pressure inside the reaction chamber. After the oxygen gas is supplied, the inside of the reaction chamber is treated with oxygen plasma for a time period T4 (S50). Then, an inert purge gas is supplied into the reaction chamber for a time period T5 to remove the residual oxygen gas out of the reaction chamber (S60). It is determined whether the thickness of the dielectric layer has reached a predetermined level or not (S70), and if not, the cycle of steps S20 to S70 are repeated multiple times until the dielectric layer is formed to the desired predetermined thickness.

In the second embodiment, the oxygen plasma treatment (S50) is performed by increasing the plasma RF power and an oxygen partial pressure concurrently with an increase in the aspect ratio of the three-dimensional structure of the semiconductor substrate. The term "aspect ratio", as referred to herein means the ratio of the height of the three-dimensional structure relative to its width. The plasma RF power is preferably in the range of about 80 to 1000 W, and the oxygen partial pressure is preferably in the range of 25 to 90%, in the case where the aspect ratio of the three-dimensional structure is above about 4 to less than about 7. In the case where the aspect ratio of the three-dimensional structure is greater than about 7 to less than about 100, the plasma RF power is preferably in the range of about 150 to 1000 W, and the oxygen partial pressure is preferably in the range of about 35 to 90%. The oxygen partial pressure refers to a ratio of the oxygen flow amount relative to the overall plasma gas flow amount. When an argon (Ar) gas as a carrier gas is supplied at 200 sccm, the oxygen flow rate of the supplied oxygen may be in the range of about 65 to 1800 sccm. The oxygen plasma treatment step (S50) can be performed over a time duration of about 0.1 to 10 seconds. In the second embodiment, the reaction chamber for forming the dielectric layer is maintained with a pressure of 0.5 to 10 torr.

Further, the temperature of the semiconductor substrate inside the reaction chamber is maintained at a temperature of 100 to 550° C.

In the second embodiment, the source gas is one selected from aluminum (Al), hafnium (Hf, lanthanum (La), tantalum (Ta), and zirconium (Zr).

After the dielectric layer is formed to a desired thickness at steps (S60, S70) in the second embodiment, a vacuum annealing treatment or an annealing treatment in the presence of an oxygen atmosphere at a temperature of 400 to 1000° C. may be further performed to improve the electric characteristics of the resulting dielectric layer.

In the second embodiment, the purging process can employ an argon gas, but an oxygen gas may be used to purge the reaction chamber in the case where the source gas does not react with the oxygen gas.

EXAMPLES

Figure 5:
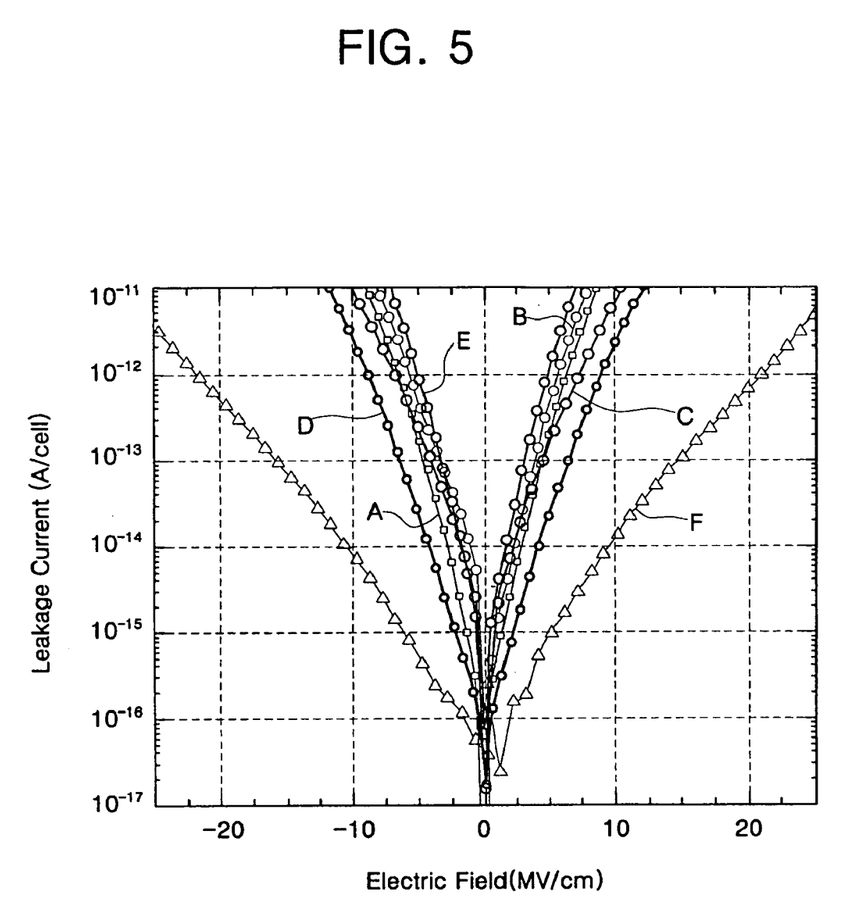
FIG. 5 is a graphical representation illustrating the leakage current characteristics of a dielectric layer according to embodiments of the present invention.

To verify the characteristics of the method of forming a dielectric layer using a PEALD technique according to the present invention, process conditions are varied to form the dielectric layer, and the results are shown in Table 1 and FIG. 5.

In particular, various process conditions according to the examples of the present invention are shown in Table 1 as follows, in which the process cycle of the second embodiment of FIG. 3 is employed.

FIG. 5 is a graphical representation illustrating the leakage current characteristics of the dielectric layer from the examples of the present invention by Table 1.

TABLE 1

|  | A | B | C | D | E | F |
|---|---|---|---|---|---|---|
| source gas | TEMAH | TEMAH | TEMAH | TEMAH | TEMAH | TEMAH |
| source gas supply time | 0.5 sec. | 0.5 sec. | 0.5 sec. | 0.5 sec. | 2 sec. | 0.5 sec. |
| carrier gas flow rate | 200 sccm | 200 sccm | 200 sccm | 200 sccm | 200 sccm | 200 sccm |
| purge gas flow rate | 100 sccm | 100 sccm | 100 sccm | 100 sccm | 100 sccm | 100 sccm |
| oxygen flow rate | 90 sccm | 90 sccm | 90 sccm | 90 sccm | 90 sccm | 150 sccm |
| oxygen plasma time | 1 sec. | 1 sec. | 1 sec. | 4 sec. | 1 sec. | 1 sec. |
| RF power | 100 W | 100 W | 250 W | 100 W | 100 W | 250 W |
| substrate temperature | 300° C. | 300° C. | 300° C. | 300° C. | 300° C. | 300° C. |
| chamber pressure | 3 torr | 1 torr | 3 torr | 3 torr | 3 torr | 3 torr |

In the above examples of A through F, a dielectric layer is formed on a semiconductor substrate having a three-dimensional structure having an aspect ratio of 7 by a PEALD method. The three-dimensional structure may be a structure having a predetermined width, length, and height, for example, a cylindrical-shaped capacitor or the like. The aspect ratio means the ratio of the height of the three-dimensional structure relative to its width. As shown in the detailed process conditions of example "A" of Table 1, a semiconductor substrate having a three-dimensional structure is loaded into a reaction chamber. The reaction chamber is maintained at a pressure of 3 torr, and the semiconductor substrate is maintained at a temperature of 300° C. A source gas, TEMAH is supplied into the reaction chamber for 0.5 seconds. The TEMAH gas includes hafnium, and its chemical formula is $Hf[N(CH_3)C_2H_5]_4$. After the source gas is supplied, the source gas compound is physically adsorbed on the semiconductor substrate and the source gas residues remaining inside the reaction chamber are removed, by supplying an argon gas at a flow rate of 100 standard cubic centimeters per minute (sccm). After the purging process is performed, oxygen gas and argon gas as a carrier gas are supplied into the reaction chamber at flow rates of 90 sccm and 200 sccm respectively, and they are plasma-treated with 100 W of RF power for a time duration of 1 second. The $HfO_2$ layer formed by the example "A" shows relatively poor leakage current characteristics of approximately $4\times10^{-13}$ A/cell in an electric field intensity of 5 MV/cm with reference to FIG. 5.

The process conditions of example "B" in Table 1 are the same as those of example "A", except that the pressure of the chamber is lowered down to 1 torr. As a result, the $HfO_2$ layer formed by example "B" shows little improvement in leakage current characteristics, which is approximately $6\times10^{-13}$ A/cell in an electric field intensity of 5 MV/cm as shown in FIG. 5, in comparison with example "A".

In example "C" of Table 1, the process conditions are the same as those of example "A", except that the RF power for oxygen plasma is increased to 250 W. As a result, the $HfO_2$ layer formed by example "C" shows little improvement in leakage current characteristics, which is approximately $1\times10^{-13}$ A/cell in the electric field intensity of 5 MV/cm as shown in FIG. 5, in comparison with example "A".

In example "D" of Table 1, the process conditions are the same as those of the example "A", except that the time for oxygen plasma treatment is increased to 4 seconds. As a result, the leakage current characteristics of the $HfO_2$ layer is slightly improved, but not substantially, which is approximately $4\times10^{-14}$ A/cell in an electric field intensity of 5 MV/cm as shown in FIG. 5, in comparison with example "A".

In example "E" of Table 1, the process conditions are the same as those of example "A", except that the supply time for TEMAH source gas is increased to 2 seconds. As a result, the leakage current characteristics of the $HfO_2$ layer is deteriorated, which is approximately $1\times10^{-12}$ A/cell in an electric field intensity of 5 MV/cm as shown in FIG. 5, in comparison with example "A".

In example "F" of Table 1, the process conditions are changed in the RF power for oxygen plasma and the oxygen supply flow rate. In particular, a semiconductor substrate having a three-dimensional structure is loaded into a reaction chamber. The reaction chamber is maintained with 3 torr of pressure and the temperature of the semiconductor substrate is maintained at 300° C. The TEMAH source gas is supplied into the reaction chamber for 0.5 seconds. After the source gas is supplied, the source gas compound physically adsorbed on the semiconductor substrate and the source gas residues remaining inside the reaction chamber are removed, by supplying an argon gas at a flow rate of 100 sccm. After the purging process is performed, oxygen gas and argon gas as a carrier gas are supplied into the reaction chamber at flow rates of 150 sccm and 200 sccm respectively, and they are plasma-treated with 250 W of RF power and for a time duration of 1 second. As a result, the leakage current characteristics of the $HfO_2$ layer formed by example "F" is improved significantly, which is approximately $1\times10^{-15}$ A/cell in the electric field intensity of 5 MV/cm as shown in FIG. 5, in comparison with examples "A" through "E".

The step coverage characteristics of the $HfO_2$ layers formed by examples "A" through "F" are all 85% or higher, which are good. In the meantime, the leakage current characteristics of the dielectric layers formed by examples of "A" through "E" are relatively poor, but the leakage current characteristics of the dielectric layer formed by example "F" is relatively superior. The leakage current deterioration in examples "A" through "E" results not from the step coverage but from lack of the oxygen radicals inside the structure holes. Further, the change in process conditions alone cannot increase the amount of the oxygen radicals and cannot improve the leakage current characteristics. However, example "F" increases the oxygen flow rate during the plasma treatment process of oxygen, to relatively increase the oxygen partial pressure of the plasma gas, and also increases the RF power during the plasma treatment process, thereby providing the result that the leakage current characteristics is improved. Therefore, the graphs of FIG. 5 illustrate that the increase of the amount of the oxygen radicals inside the thin films can be achieved by controlling the RF power during the oxygen plasma treatment and the oxygen flow rate concurrently. In example "F", the oxygen flow rate is 150 sccm, but the oxygen partial pressure can be controlled in the range of 35 to 90%. If the oxygen partial pressure exceeds 90%, the plasma will not be generated because of the lack of the argon gas as a carrier gas. Further, the RF power is 150 W in the example, but the RF power may optionally be increased in the range of 150 to 1000 W. However, too much of an increase in RF power may cause the haze phenomenon at the edge portion of the wafer even though the oxygen partial pressure is increased, and therefore, it is preferable to perform the procedure with an RF power of less than about 1000 W.

Figure 6:
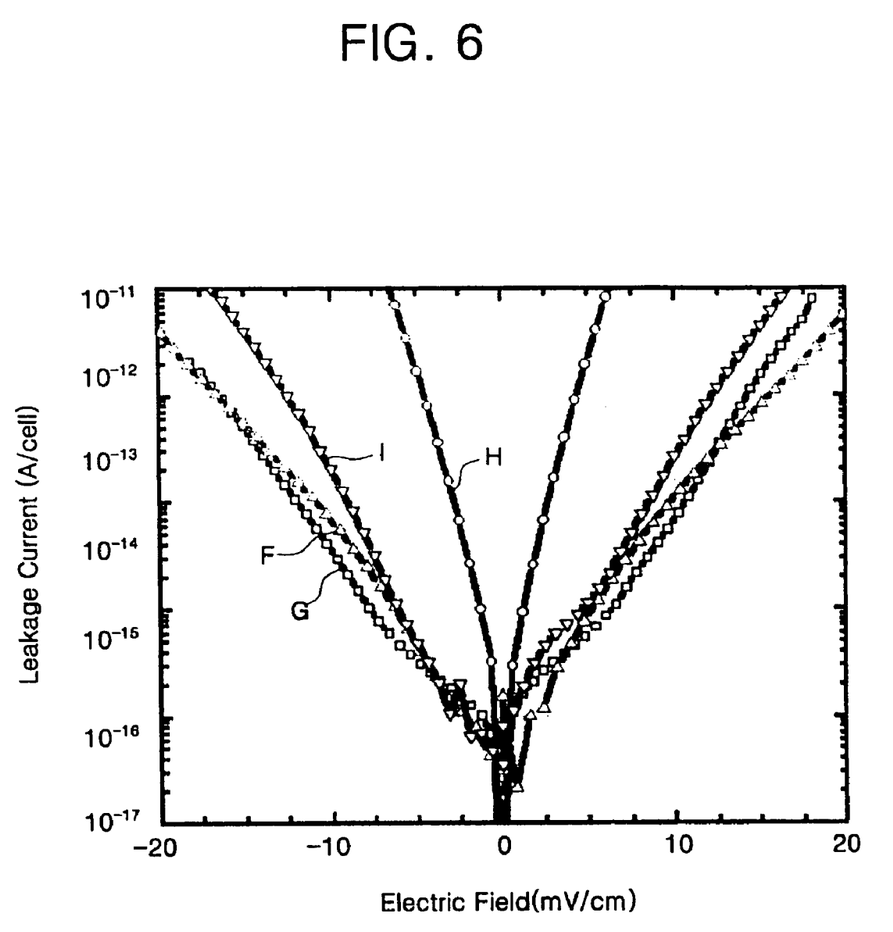
FIG. 6 is a graphical representation illustrating the leakage current characteristics of a dielectric layer according to other embodiments of the present invention.

FIG. 6 is a graphical representation illustrating leakage current characteristics of a dielectric layer formed according to other embodiments of the present invention.

Referring to FIG. 6, graph "G" shows the leakage current characteristics of the $HfO_2$ thin film formed in a concave-typed capacitor having an aspect ratio of 4, and the $HfO_2$ thin film is formed by a PEALD technique. The aspect ratio means the ratio of the height of the capacitor relative to its width. In more detail, a semiconductor substrate having a structure with an aspect ratio of 4 is loaded into a reaction chamber, and a source gas TEMAH is supplied for a time period of 0.5 seconds. The TEMAH gas includes hafnium, and its chemical formula is $Hf[N(CH_3)C_2H_5]_4$. After the source gas is supplied, the source gas remaining inside the reaction chamber is purged from the reaction chamber, by supplying 100 sccm of an argon gas. After the purging process is performed, oxygen gas and argon gas as a carrier gas are supplied into the reaction chamber, and they are plasma-treated with 100 W of RF power and for a time period of 1 second. The oxygen gas and the argon gas are supplied at flow rates of 90 sccm and 200 sccm respectively, so that an oxygen partial pressure is 31%. The reaction chamber is maintained with 3 torr of pressure, and the semiconductor substrate is maintained at a temperature of 300° C. The graph of example "G" illustrates improved leakage current characteristics, that is, about $7 \times 10^{-16}$ A/cell of leakage current in an electric field intensity of 5 MV/cm. The dielectric layer in an three-dimensional structure having an aspect ratio of 4 exhibits favorable leakage current characteristics even when 100 W of RF power is applied with 31% of oxygen partial pressure.

On the contrary, the graph of example "H" having a cylindrical shaped structure with an aspect ratio of 7, which is formed by the same conditions as those of the example "G", shows poor leakage current characteristics, that is, about $1 \times 10^{-13}$ A/cell of leakage current in an electric field intensity of 5 MV/cm.

Example "F" includes a dielectric layer that is formed in the three-dimensional structure having an aspect ratio of 7 by a PEALD technique. The dielectric layer is also formed by applying 250 W of RF power in comparison with the process conditions of samples "G" and "H". Further, the oxygen plasma flow rate is increased to 150 sccm and the oxygen partial pressure is increased to 43%, to form an $HfO_2$ thin film. As a result, the leakage current characteristics are improved, with $1 \times 10^{-15}$ A/cell of leakage current in an electric field intensity of 5 MV/cm, which is significantly improved in comparison with example "H", and is almost similar to the characteristics of example "G" having an aspect ratio of 4.

In example "I", a thin film is formed on a structure having an aspect ratio of 7 by the same process conditions as those of example "G", but an optimized ALD technique using $O_3$ as a reactant gas is employed instead of oxygen plasma. As a result, the leakage current characteristics of example "I" is almost similar to that of example "F".

As a result, the leakage current characteristics are improved as shown in the graph of example "F" in the case of increasing the RF power and the oxygen partial pressure during the oxygen plasma treatment because oxygen radicals inside the structure hole are increased.

As described above, in the method of forming a dielectric layer using a PEALD technique according to the present invention, a dielectric layer can be formed for preventing the leakage current deterioration phenomenon by increasing oxygen radicals inside structure holes, as well as overcoming the problems of the conventional ALD method of forming a dielectric layer by a low deposition rate, and providing excellent step coverage characteristics by appropriately controlling the RF power during the oxygen plasma treatment and the oxygen flow rate for a desired oxygen partial pressure.

Therefore, the present invention provides a method of forming a dielectric layer having excellent step coverage characteristics using a PEALD technique while solving the problem of the decrease in a deposition speed by an ALD method.

Further, leakage current deterioration of the dielectric layer can be prevented by increasing the amount of oxygen radicals present inside structure holes, by increasing the oxygen partial pressure of the plasma gas.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A method of forming a dielectric layer using a plasma enhanced atomic layer deposition technique comprising steps of:
    loading a semiconductor substrate having a three-dimensional structure into a reaction chamber, the three-dimensional structure having an aspect ratio, wherein a level of an RF power and a partial pressure of an oxygen gas corresponds to the aspect ratio, and wherein when the aspect ratio is increased, the level of the RF power and the partial pressure of the oxygen gas are increased; and
    repeatedly performing the following steps until a dielectric layer with a desired thickness is formed:
    supplying a source gas into the reaction chamber;
    stopping the supply of the source gas and purging the source gas remaining inside the reaction chamber; and
    supplying the oxygen gas into the reaction chamber after purging the source gas, and applying the RF power for oxygen plasma treatment.

2. The method according to claim 1, further comprising purging the source gas following each oxygen plasma treatment.

3. The method according to claim 1, wherein the temperature of the semiconductor substrate is maintained at about 100 to 550° C.

4. The method according to claim 1, wherein purging the source gas is performed by supplying Ar or $O_2$ gas.

5. The method according to claim 1, wherein the pressure of the reaction chamber is maintained at about 0.5 to 10 torr.

6. The method according to claim 1, wherein the oxygen plasma treatment is performed for a time duration of about 0.1 to 10 seconds.

7. The method according to claim 1, wherein the source gas includes one selected from the group consisting of aluminum (Al), hafnium (Hf), lanthanum (La), tantalum (Ta), and zirconium (Zr).

8. The method according to claim 1, wherein the dielectric layer is one layer selected from the group consisting of $Al_2O_3$, $HfO_2$, $Ta_2O_5$, $La_2O_5$, and $ZrO_2$.

9. The method according to claim 1, further comprising performing a vacuum annealing treatment or an annealing treatment in the presence of an oxygen atmosphere at a temperature of about 400 to 1000° C. after forming the dielectric layer.

10. The method according to claim 1, wherein when the aspect ratio of the three-dimensional structure is above about 4 to less than about 7, the corresponding RF power is in the range of about 80 to 1000 W, and the corresponding oxygen partial pressure is in the range of about 25 to 90 %.

11. The method according to claim 1, wherein when the aspect ratio of the three-dimensional structure is above about 7 to less than about 100, the corresponding RF power is in the range of about 150 to 1000 W, and the corresponding oxygen partial pressure is in the range of about 35 to 90 %.

12. The method according to claim 1, wherein flow rates of the argon gas and the oxygen gas supplied for the oxygen plasma treatment are about 200 sccm and in the range of about 65 to 1800 sccm respectively.

13. The method according to claim 1, further comprising supplying an oxygen gas before the oxygen plasma treatment.

14. A method of forming a dielectric layer using a plasma enhanced atomic layer deposition technique comprising steps of:

loading a semiconductor substrate having a three-dimensional structure into a reaction chamber, the three-dimensional structure having an aspect ratio, wherein a level of an RF power and a partial pressure of an oxygen gas corresponds to the aspect ratio, and wherein when the aspect ratio is increased, the level of the RF power and the partial pressure of the oxygen gas are increased; and repeatedly performing the following steps until a dielectric layer with a desired thickness is formed:

supplying a source gas into the reaction chamber; stopping the supply of the source gas and purging the source gas remaining inside the reaction chamber; and supplying the oxygen gas into the reaction chamber after purging the source gas, and applying the RF power for oxygen plasma treatment, wherein when the aspect ratio of the three-dimensional structure is above about 4 to less than about 7, the corresponding RF power is in the range of about 80 to 1000 W, and the corresponding oxygen partial pressure is in the range of about 25 to 90%.

15. A method of forming a dielectric layer using a plasma enhanced atomic layer deposition technique comprising steps of:

loading a semiconductor substrate having a three-dimensional structure into a reaction chamber, the three-dimensional structure having an aspect ratio, wherein a level of an RF power and a partial pressure of an oxygen gas corresponds to the aspect ratio, and wherein when the aspect ratio is increased, the level of the RF power and the partial pressure of the oxygen gas are increased; and repeatedly performing the following steps until a dielectric layer with a desired thickness is formed:

supplying a source gas into the reaction chamber;

stopping the supply of the source gas and purging the source gas remaining inside the reaction chamber; and supplying the oxygen gas into the reaction chamber after purging the source gas, and applying the RF power for oxygen plasma treatment, wherein when the aspect ratio of the three-dimensional structure is above about 7 to less than about 100, the corresponding RF power is in the range of about 150 to 1000 W, and the corresponding oxygen partial pressure is in the range of about 35 to 90 %.

* * * * *